United States Patent [19]
Gibson

[11] Patent Number: 6,029,263
[45] Date of Patent: Feb. 22, 2000

[54] INTERCONNECT TESTING USING NON-COMPATIBLE SCAN ARCHITECTURES

[75] Inventor: Walter E. Gibson, San Jose, Calif.

[73] Assignee: Tandem Computers Incorporated, Cupertino, Calif.

[21] Appl. No.: 08/268,370

[22] Filed: Jun. 30, 1994

[51] Int. Cl.[7] .................................................. G01R 31/28
[52] U.S. Cl. ........................................... 714/726; 714/733
[58] Field of Search .................................. 371/22.3, 22.1; 324/158 R; 714/25, 30, 37, 726, 727, 729, 733

[56] References Cited

U.S. PATENT DOCUMENTS

| | | |
|---|---|---|
| 5,172,377 | 12/1992 | Robinson et al. . |
| 5,202,625 | 4/1993 | Farwell ................................ 324/158 R |
| 5,260,950 | 11/1993 | Simpson et al. . |
| 5,390,191 | 2/1995 | Shiono et al. ........................... 371/22.3 |
| 5,444,715 | 8/1995 | Gruetzner et al. ...................... 371/22.3 |
| 5,448,166 | 9/1995 | Parker et al. .......................... 324/158.1 |

*Primary Examiner*—Robert W. Beausoliel, Jr.
*Assistant Examiner*—Nadeem Iqbal
*Attorney, Agent, or Firm*—Townsend and Townsend and Crew LLP

[57] ABSTRACT

A method is provided that provides a test of an interconnect that communicates information between two digital circuits. One of the digital circuits is constructed to be "scannable" so that it at least includes scannable registers capable of applying signals to, and sampling signals at, the interconnect. The other digital circuit has a different scan architecture such as, for example, that specified by IEEE Standard 1149.1. The method allows the interconnect between the two digital circuits, each having scan architecture that is not compatible with that of the other, to be tested.

5 Claims, 7 Drawing Sheets

INTERCONNECT TESTING USING NON-COMPATIBLE SCAN ARCHITECTURES

BACKGROUND OF THE INVENTION

The present invention is directed generally to testing digital systems, and more particularly to using scan test techniques to test the interconnecting signal lines between digital circuits employing different or non-compatible scan test architectures.

As integrated circuit technology has advanced over the past decade or so, circuit density has increased significantly. In order to test such circuitry, a variety of techniques have been advanced. One such technique enjoying a not insubstantial use at present determines nothing more than whether particular digital circuit, or system, is operable or not; e.g., a GO/NO-GO test technique. This technique requires use of "scannable" registers to be incorporated in the integrated circuit, forming the flip-flops, counters, latches, registers, and the like. The scannable register are structured to selectively operate in one of two modes: a normal mode to perform functions within the design of the circuit or system that includes the scannable register, and responsive to test signals in a test mode in which the scannable register is combined with other scannable registers to form one or more long shift registers or "scan chains" that receive test patterns. According to one version of this technique, the circuit or system tested is repeatedly placed in a pseudo-random state, allowed to execute one normal cycle, and the resultant state extracted and combined with other extracted states to form a signature that is compared to a "golden" signature developed from a known good integrated circuit or group of integrated circuits—identical to that under test. The compare provides the GO/NO-GO indication. Examples of this technique can be seen in U.S. Pat. Nos. 4,718,065. Pseudo-random scan test techniques, such as described above, may also be used for receiving predetermined test patterns make specific test determinations.

Scan test architectures, whether for pseudo-random scan testing, or for testing using predetermined test patterns, or both, are at times different; some may be more robust than others, or perform the scan test differently, thereby requiring different scan test architecture. For example, the more robust scan test methods provide for the testing to be performed "at speed" (i.e., testing is performed at the speed of the system clock used by the circuit or unit under test). Another architecture, albeit less robust than full (at speed) PRST, is that described by IEEE Standard 1149.1, promulgated by the Joint Test Action Group (JTAG), a collaborative organization comprised of major semiconductor users in Europe and North America. According to this Standard, the architecture will provide for tests that, among other things, can sample various inputs and outputs of the unit under test (external tests), as well as being able to test certain of the internal circuits of the unit under test (internal tests).

Digital systems that mix different (and at some times, non-compatible) types of scan test architectures will often require separate tests to be conducted on each of the different architectures at the cost of extra time and labor, additional signal leads and pins, and the like. The problem is exacerbated when the interconnect carrying signals between the two scan architectures is to be tested, often necessitating manual methods for such testing which is expensive in both time and labor.

SUMMARY OF THE INVENTION

The present invention provides a method for synchronously testing the interconnecting signal lines (hereinafter, "interconnect") between two non-compatible scan architectures, one of which employs the scan architecture specified by the IEEE 1149.1 Standard. (Unless otherwise noted, the IEEE 1149.1 Standard will hereinafter be referred to as the "IEEE Standard," or just "Standard.")

Broadly, the method of the present invention provides a test processor coupled to provide test signals to at least two digital circuits in the form of integrated circuits to test an interconnect (e.g., including bi-directional, shared bus structures, and other signal lines) that connect the two integrated circuits to one another. One integrated circuit employs the IEEE Standard scan architecture; the other has a different, non-compatible scan architecture that includes at least scan registers situated to sample digital signals at, and/or apply digital signals to, the signal-carrying interconnect. According to the inventive method, the test processor first places both digital circuits in a mode such that any shared buses between them are placed in their high impedance or tri-state mode so that both do not attempt to drive any shared busses at the same moment. Next, the test processor applies predetermined test patterns to each integrated circuit to set those scannable registers that communicate digital signals to, or receive digital signals from, the interconnect ("boundary registers") to predetermined states. Then, using the IEEE Standard test technique, the Standard's scannable registers of the one integrated circuit are caused to sample the I/O pin connections of the corresponding integrated circuit chip, and the sample extracted for observation. Then, the boundary registers of the other integrated circuit are subjected to a normal execution cycle, allowing the scannable boundary registers to sample the signals communicated to by the interconnect to be sampled and also extracted for observation. The samples from the two integrated circuits are compared to determine if what was extracted is what was expected from the predetermined test patterns applied, in effect determining if the test pattern applied to one integrated circuit was coupled by the interconnection to the other. If the comparison so indicates, the test continues to apply additional test patterns until all possible states capable of being applied to the interconnecting signal lines have been exhausted. If the initial compare, or any subsequent compares, indicate a mismatch, an error is declared and the system determined to be inoperable.

DETAILED DESCRIPTION OF THE INVENTION

The Figures (i.e., FIGS. 2, 3, and FIGS. 4A–4H) respectively show a representative scannable register construction (FIG. 2), the state diagram required by IEEE Standard (FIG. 3), and employment of scannable registers at various of the pin connections of an integrated circuit. It is not the intention of this disclosure to claim that the architectures shown in FIGS. 2 and 4A–4H, or that the state diagram of FIG. 3 (derived from the 1149.1 Standard), are new. Rather, they are presented and discussed here in order to ensure a complete and proper understanding of the method of the present invention.

Figure 1:
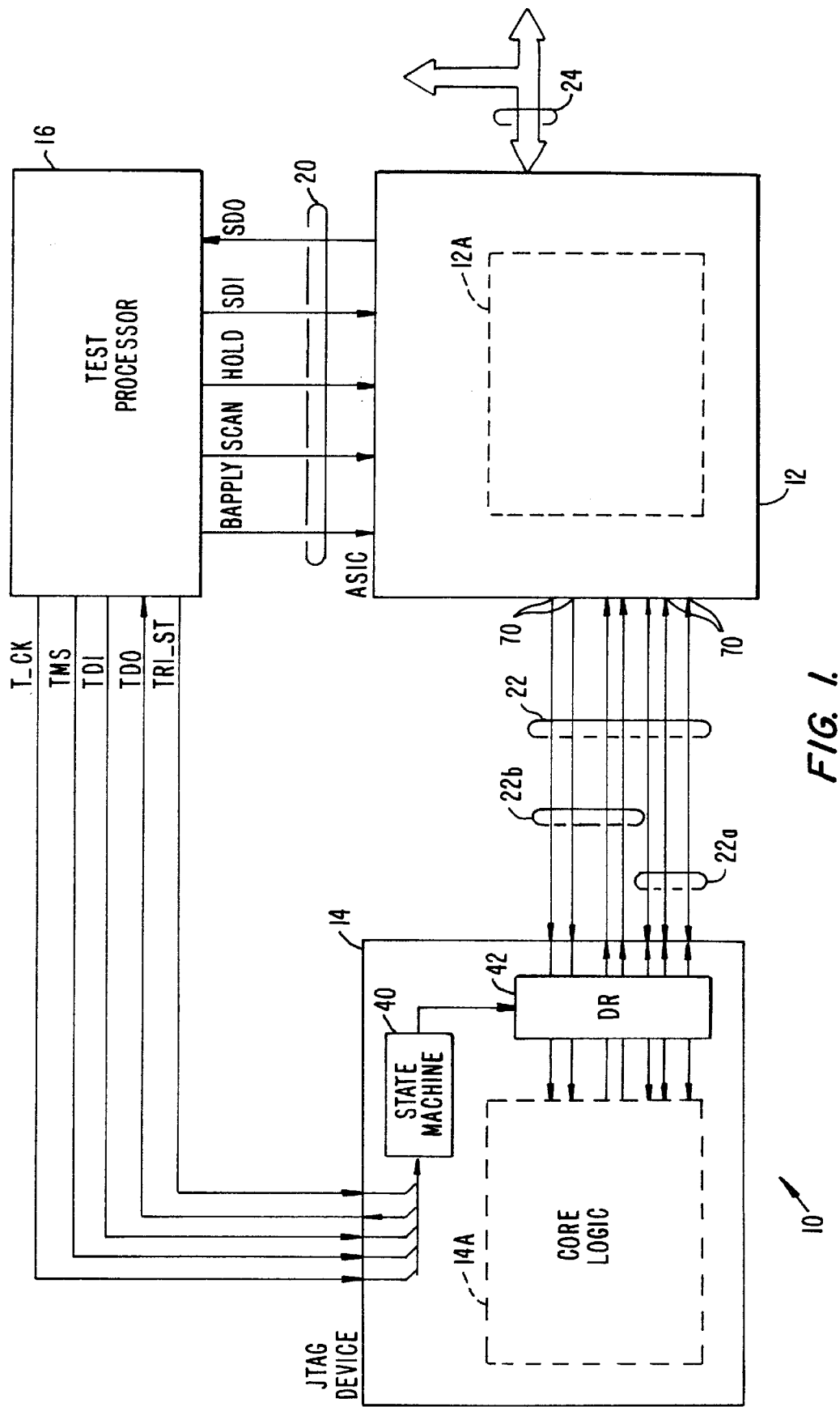
FIG. 1 is a block diagram illustrating two integrated circuits of a digital system connected to a test processor to implement the method of the present invention.

Turning now to FIG. 1, there is illustrated at least a portion of a digital system, designated generally with the reference numeral 10, including an application specific integrated circuit (ASIC) 12, employing a scan architecture not based upon the IEEE Standard, and an integrated circuit 14 that does employ the scan architecture of the Standard (hereinafter referred to as the "JTAG device"). Also shown, which may or may not be a part of the system 10, but may be external thereto, is a test processor 16. The test processor is coupled to the ASIC 12 for applying the test signals scan data in (SDI), HOLD, SCAN, and BAPPLY, and for receiving the scan data out (SDO) signal line from the ASIC 12.

The ASIC 12 is connected, at connector pins 70, to an interconnect 22 for communicating signals between the ASIC 12 and the JTAG device 14 to which the interconnect 22 also connects. The interconnect 22 may include a shared bus 22a which uses such devices as tri-state drivers in order to provide the bus sharing, as is conventional, and other signal lines 22b. In addition, the ASIC 12 may be connected to other devices by a shared bus 24, which also employs conventional tri-statable devices for bus sharing.

The ASIC 12 is structured for implementing pseudo-random scan test (PRST) techniques, although other scan test architectures may also be used. Important for the present invention is that the ASIC 12 have register stages that are configured to be scannable in the sense that they are capable of selectively operating in one of two modes: a normal mode in which the scannable register may perform according to the design of the ASIC 12 (e.g., as a flip-flop, counter, or the like), and a test mode in which the scannable register is connected with other scannable registers to form a one or more long shift registers or "scan chains" into which data may be shifted for test purposes. If the test purpose is PRST, the normal use of the scannable registers is to repeatably place them in their test mode and (1) shift in a serial string of pseudo-random data, (2) return them to their normal state for one execution of the clock of the ASIC 12, and (3) return them to their test mode for shifting out the resultant data, iteratively forming therefrom a test signature that can be then compared to a "Golden Signature" to determine if the ASIC 12 (or system 10) is good.

Figure 2:
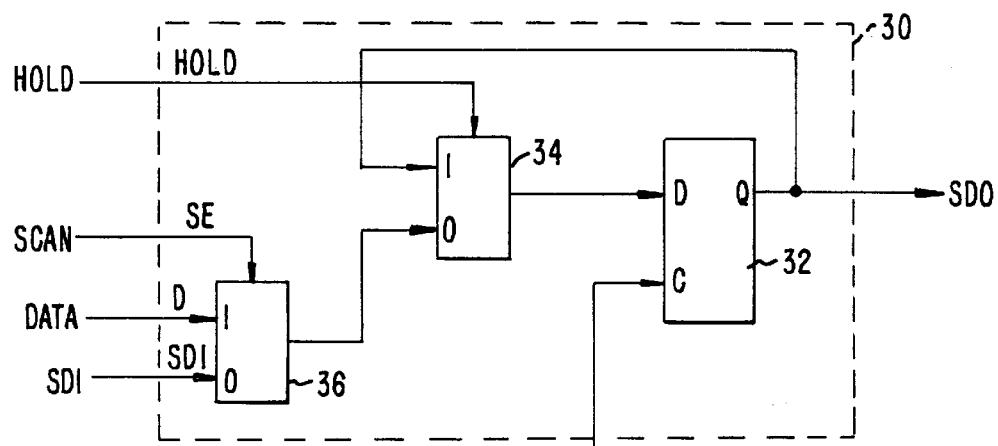
FIG. 2 is a block diagram illustrating a representative scannable register that may be employed in connection with the present invention.

Referring for the moment to FIG. 2, a representative architecture for a scannable register, designated generally with the reference numeral 30, is shown. As illustrated, the scannable register 30 has as its memory element a D-type flip-flop 32 that is clocked by the free-running system clock ($SYS_{13}CK$) used by the internal logic 12A of the ASIC 12 (not shown in FIG. 1). The data (D) input of the flip-flop 32 receives the one-bit output of a two-input multiplexer 34, one input of which receives the one-bit output of yet another multiplexer 36. The other input of the multiplexer 34 receives the output (Q) of the flip-flop 32. The multiplexer 36 receives at its two inputs system data (DATA) according to the design in which the scannable register 30 is employed in the ASIC 12, and scan data (SDI) which may be from the output of another scannable register, or if the scannable register 30 is the first in the chain of the ASIC 12, it will receive that communicated from the test processor 16.

The data output (Q) of the flip-flop 32 forms the output data (SDO) of the scannable register which is communicated to the input (SDI) of another scannable register or, if the scannable register 30 is the last in a chain of scannable registers, the output will form that which is communicated from the ASIC 12 to the test processor 16.

Briefly, operation of the scannable registers 30, as they are employed in the ASIC 12 is as follows. When the ASIC 12 is not subjected to testing, i.e., when operating in its normal mode, the test processor 16 will keep de-asserted the test signals HOLD, SCAN, and BAPPLY (FIG. 1). Thus, the multiplexers 34, 36 will select system data (DATA) to be applied to the data input (D) of the flip-flop 32. Conversely, when the test processor asserts its test signals, the following can occur. There may be times when the state of the scannable register 30 is desired to be held frozen. For this purpose, the HOLD signal will be asserted by the test processor 16 which, as FIG. 2 illustrates, selects and couples the data output (Q) of the flip-flop 32 to its input (D) with each pulse of the $SYS_{13}CK$. Asserting the SCAN test signal will select, for application to the data input (D) of the flip-flop 32, the SDI signal, thereby including the scannable register 30 and the scan chain so formed. Thus, the SCAN signal is the test signal that forms the scan chain. When the HOLD test signal is asserted, the SCAN test signal has no affect. Use of the scannable register 30 in connection with the present invention will be described more fully below, after showing how such scannable registers are employed to sample and/or apply signals to the connector pins of the ASIC 12.

Returning to FIG. 1, the JTAG device 14, as indicated above, employs the IEEE Standard. Thus, according to that Standard, it will include in its design a controllable state machine 40, and a plurality of scannable data registers 42. The Standard (1149.1) specifies a scannable instruction register and a scannable bypass register, but those registers are not used in the present invention (except as used to select the scannable data registers 42, according to the IEEE Standard) and, therefore, are not shown to prevent unduly cluttering FIG. 1, and the discussion.

The state machine 40 will receive test signals from the test processor 16 that control the state machine's operation as defined in the Standard (1149.1) which, in turn, controls the functional operation of the scannable registers 42 (as well as an instruction register (not shown) and bypass register (not shown), required by the Standard). That control will guide the state machine 40 through the states shown in the state diagram 50 illustrated in FIG. 3, and described below. To effect this control, the test processor 16 produces four test signals, three of which are specific to the IEEE Standard: a test clock ($T_{13}CK$) signal, a test mode select (TMS), and a test data in (TDI) signals. The fourth test signal, a tri-state control signal ($TRI_{13}ST$) is not specified by the Standard. In response to the $T_{13}CK$, TMS, and TDI test signals, the test processor 16 may receive a test data out (TDO). The $T_{13}CK$ signal clocks the state machine though its various states. The path that the state machine 40 will take is determined by the state of the TMS test signal when clocked by $T_{13}CK$. Data applied to the JTAG device 14 from the test processor 16, via the TDI signal line, can be scanned into the scannable data registers 42, and data can be extracted from the scannable registers 42 and returned to the test processor by the TDO signal line.

The scannable data register 42, in compliance with the Standard (1149.1), will include scannable registers that are coupled to receive signals from, or communicate signals to, the interconnect 22, and the tri-state enable bits to apply signals to the shared bus 22a.

The JTAG device 14 may, as illustrated in FIG. 1, connect to devices (e.g., ASIC 12) by shared information buses. Such shared information buses, such as the bus structure 22*a*, typically have driver circuits capable of being placed in high impedance or tri-stated mode to permit such sharing. According to the method of the present invention it is advantageous to be able to place those circuit drivers connecting the JTAG device to a shared bus in its high impedance mode and, for that purpose, a tri-state signal (TRI$_{13}$ST) is provided by the test processor 16 that, when asserted, places all such tri-statable driver circuits of the JTAG device 14 in their high-impedance states.

Figure 3:
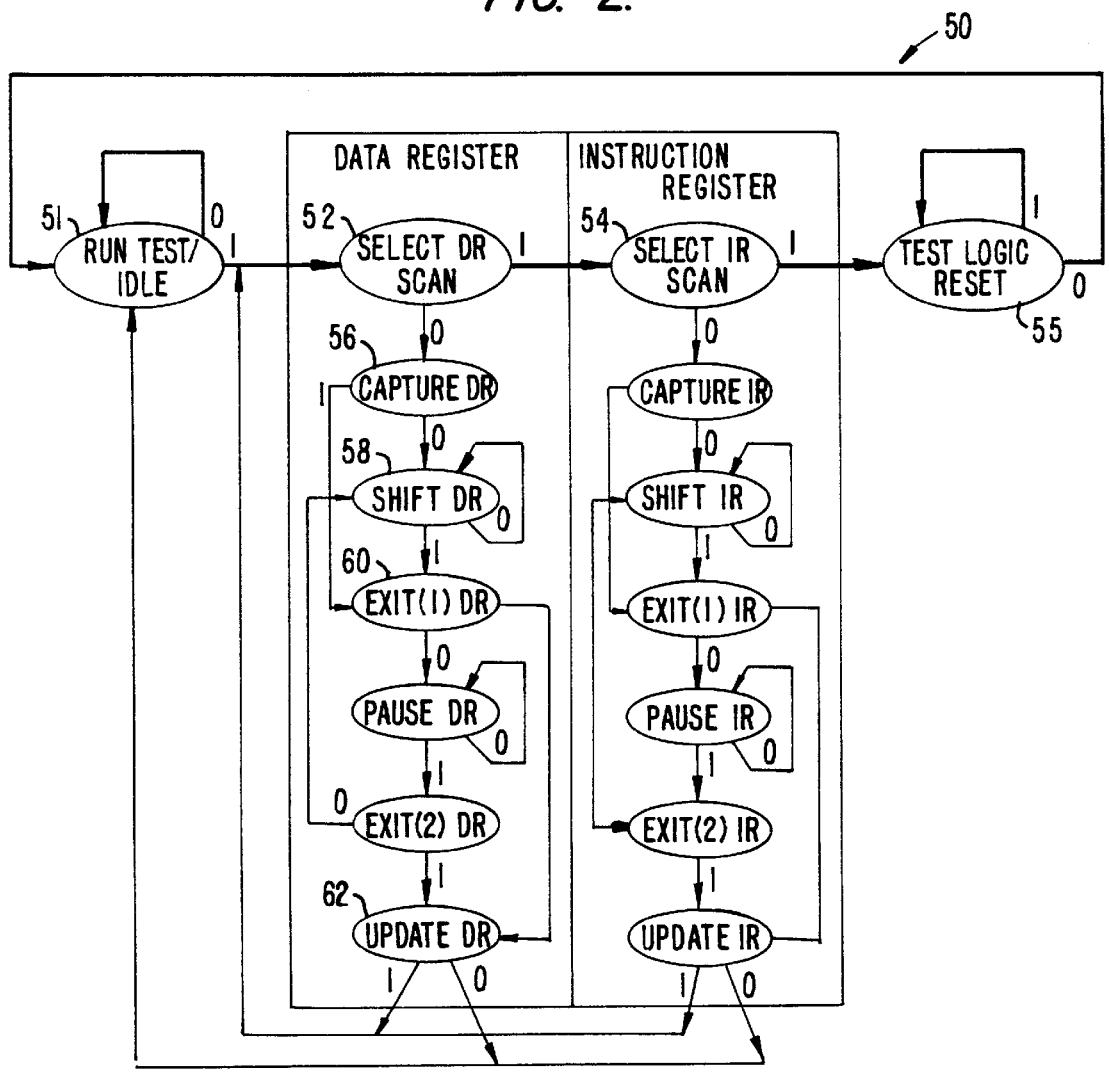
FIG. 3 is the state diagram of the IEEE Standard for employing the scan tests suggested by that standard.

The particular logic or circuit design used to implement the state machine 40 and scannable registers 42 is up to the maker of the device, so long as it follows the operation recommended by the IEEE Standard, as illustrated by the state diagram of FIG. 3. Referring to that state diagram, operation of the state machine 40 and the scannable data registers 42 will be according to that state diagram in the following manner. First, the state machine 40 is run to ensure that it passes through the Reset state 55 to the Idle state 51. Asserting TMS with T$_{13}$CK will move the state machine from Idle state 51 to state 52. State 52 forms the gateway, so to speak, to the series of states (56, . . . , 62) that control and manipulate the scannable data registers 42. If TMS remains asserted, the state machine will bypass that gateway and move onto a state 54 which is the gateway to a series of states that controls operation of the scannable Instruction register (not shown; see IEEE Standard). However, it is pertinent here only that the data register path (states 56, . . . , 62) be followed and, therefore, to follow that path when in state 52 TMS is dropped, so that the next pulse of T$_{13}$CK will move the state machine into its "capture" state 56. When in state 56 the state machine commands the scannable registers 42, whose inputs are coupled to the connector pins of the JTAG device 14 of the interconnect 22, to be set to the signal states then applied to those signal pins. Then, TMS is dropped to move the state machine to state 58 where the content of the scannable data registers 42 may be shifted out, so long as the TMS signal is kept un-asserted. Data may also be shifted in to the scannable data registers 42, and if that data is to be applied to the pins of the JTAG device 14, TMS is asserted to move the state machine through an exit state 60 and a update state 62, where the content shifted into the scannable registers 42 are applied to their outputs which, in turn, apply them to the various output pins of the JTAG device that connect to the interconnect 22. From the update state 62 the state machine may either be returned to its Idle state 51, or may be passed again through the data register path states 52, 56, etc. Use of the state machine shown in FIG. 3, together with the state machine 40 and scannable data registers 42 formed on the JTAG device 14 will be described in connection with discussion of the method of the present invention below.

Figure 4A:
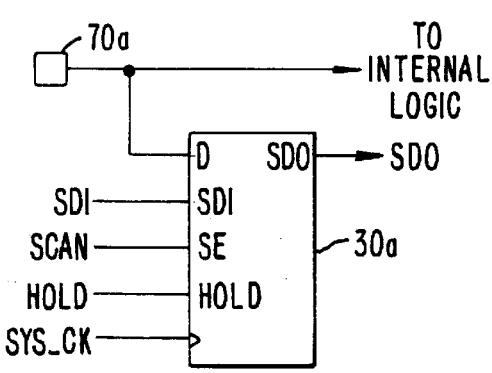
FIGS. 4A–4H are block diagrams, illustrating the various types of interconnections used by the application specific integrated circuit (ASIC) shown in FIG. 1.

Continuing with FIG. 1, the pin connections of the ASIC 12 that receive signals communicated to the ASIC 12, or couple signals from the ASIC 12, may be received directly by, or communicated directly from, a scannable register. If not, the scannable registers are added. Registers that receive signals from the connector pins of the ASIC 12, or communicate signals directly to those pins, are herein referred to as "boundary" registers. Certain rules are necessary for using boundary registers. Those rules are illustrated in FIGS. 4A–4H, and are as follows:

1. For an input pin that does not couple a signal directly to a scannable register, a boundary scannable register is added, as illustrated in FIG. 4A. As FIG. 4A indicates, a scannable register 30*a* is specifically provided to receive data applied to an input pin 70*a*. In addition to receiving the SCAN and HOLD at its scan enable (SE) and HOLD inputs, respectively, the boundary register 30*a* also receives a SDI input from a prior scannable register. The data output (Q) of the boundary register goes to the SDI input of another boundary register or scannable register. (The first scannable register of any PRST scan chain formed for a test will receive at its SDI input the SDI input of the ASIC 12 that, in turn, is connected to receive the scan in data provided by the test processor 16 on the SDI line. Similarly, the last scannable register in a scan chain will have its SDO output connected to the SDO output of the ASIC 12, thus returning scan out data to the test processor 16.) In addition to being applied to the data (D) input of the boundary register 30*a*, the input pin 70*a* is communicated to the internal logic 12A of the ASIC 12.

Figure 4B:
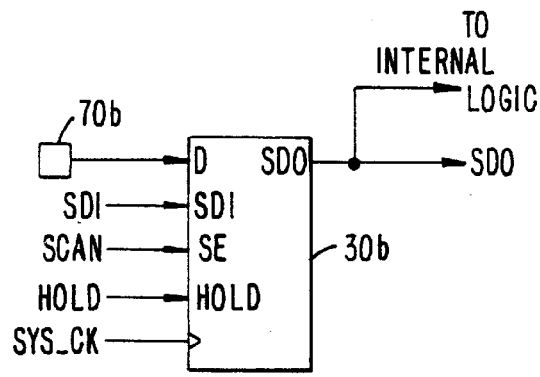

2. For each input pin connection of the ASIC 12 that, according to the functional design of the ASIC 12, connects directly to a scannable register, that scannable register may function also as a boundary register and, therefore, is shared between the normal and test modes. This is illustrated in FIG. 4B showing an input pin 70*b* applied to the data (D) input of a scannable register 30*b*. The data output (Q) is coupled to both other logic of the internal logic 12A and also forms the scan data output (SDO) for that boundary register that is coupled to another boundary register or scannable register.

Figure 4C:
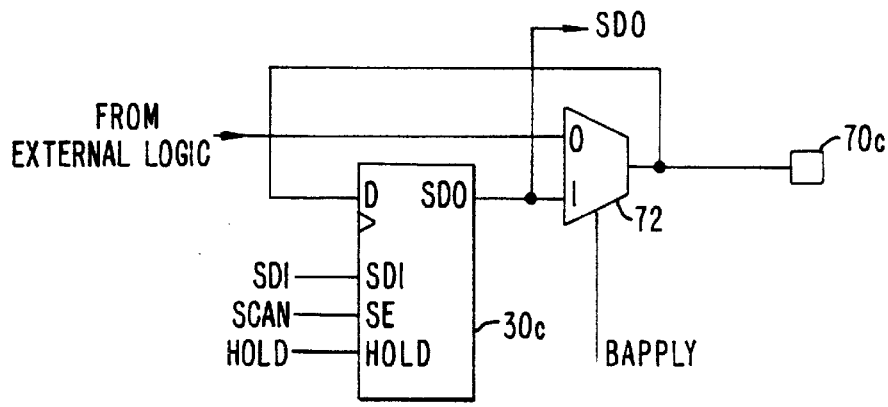
Figure 4D:
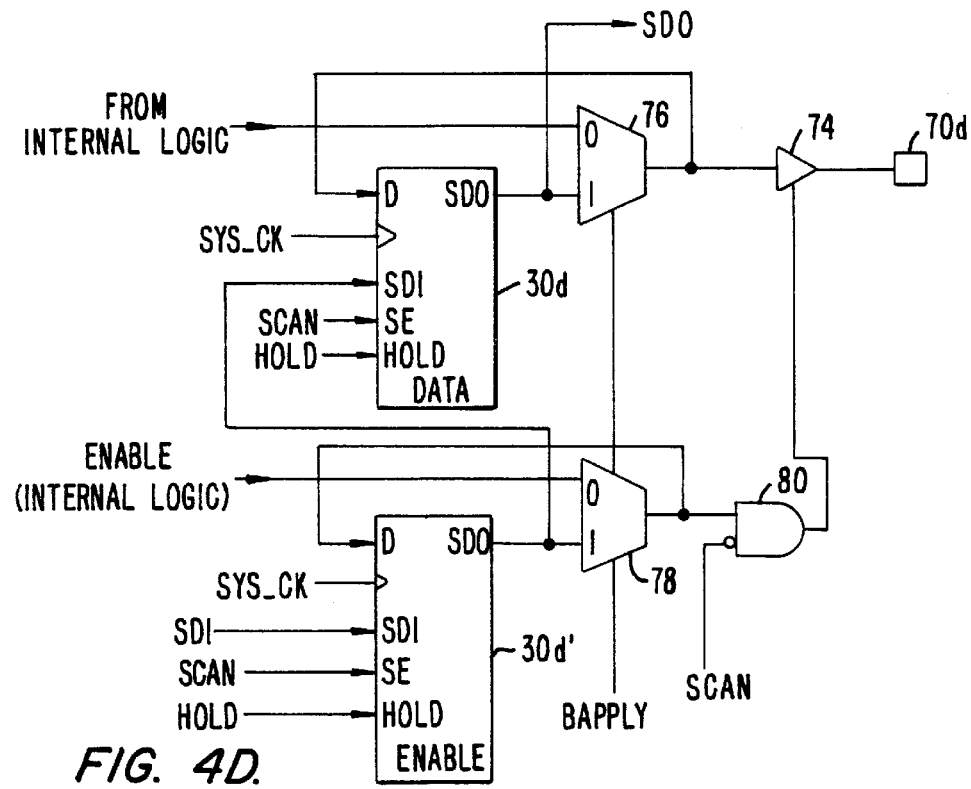

3. Output pins that receive, directly, signals from the internal logic require the addition of boundary registers, as illustrated in FIG. 4C (boundary register 30*c*). In addition, a multiplexer 72 is added so that the content of the boundary register 30*c* can be applied to the (output) pin connection 70*c* in favor of that supplied by the internal logic, when the test signal BAPPLY is asserted. FIG. 4D illustrates a pin connection 70D that connects to a shared signal line (i.e., one forming a shared bus). A tri-state driver 74 receives the output of a multiplexer 76 that selects between the signal from the internal logic 12A of the ASIC 12 (FIG. 1) and a added boundary register 30*d*. Tri-state control of the driver 74 is effected by an enable signal supplied from a AND gate 80 having a negative input that receives the SCAN test signal, and a positive input that receives the output of a multiplexer 78. The multiplexer 78 selects between an enable signal from the internal logic and the SDO output (which is, of course, the data (Q) output of the flip-flop; see FIG. 2) of the scannable register 30*d*'. During normal operation, the BAPPLY and SCAN test signals are not asserted and, therefore, the input to the driver circuit 74 is supplied by the internal logic, as is the enable signal. During tests, however, the driver circuit may be placed in a tri-state mode when SCAN is asserted. Conversely, the enable signal for the tri-state driver circuit 74, and data signal may be supplied by the boundary registers 30*d* and 30*d*' when the BAPPLY test signal is asserted, and the SCAN signal is deasserted.

Figure 4E:
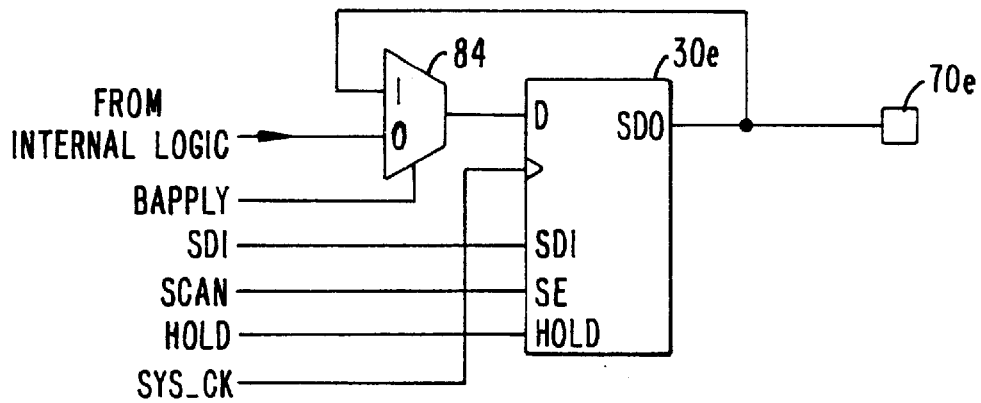
Figure 4F:
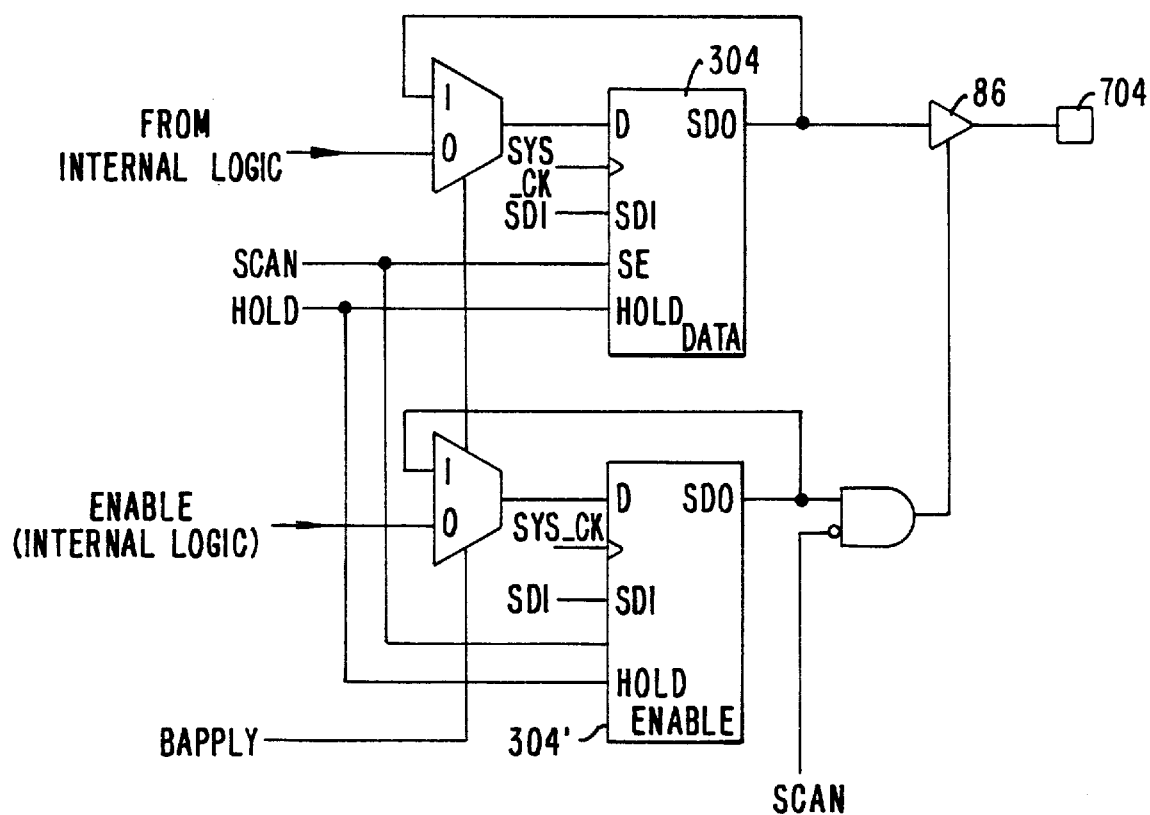

4. FIGS. 4E and 4F illustrate boundary registers that "share" normal and test modes. FIG. 4E shows a scannable register that connects directly to an output pin 70*e* of the ASIC 12, while FIG. 4F illustrates a boundary register 30*f*. In both cases, when the BAPPLY and SCAN signals are not asserted, the scannable boundary registers 30*e* (FIG. 4E) and 30*f* (FIG. 4F) perform their normal function to register data from the internal logic for application to the output pins 70*e*, 70*f* of the ASIC 12. Conversely, when in test mode, the registers 30*e*, 30*f* will receive and apply a test data to the corresponding output pins. In particular, FIG. 4F illustrates the logic used to apply a signal to the output pin 70*f* which, in turn, connects to a one of the signals lines that make up the shared bus 22a of the interconnect 22. As illustrated, a tri-state driver 86 is enabled (or disabled) by the content of the (scannable) enable register 30f' (in normal mode of operation, by an ENABLE signal supplied from the internal logic 12A of the ASIC 12A or, when in test mode, a part of a test pattern). When in test mode, the SCAN test signal may be asserted to override the content of the scannable enable register 30f' to disable the tri-state driver circuit 86. As will be seen when the method of the present invention is described below, it is sometimes necessary that the data applied to the output pins be maintained during a one cycle execution step. For that reason, the SDO outputs of the boundary registers 30e, 30f and 30f' are returned to the data inputs (D) of those registers as illustrated in FIGS. 4E and 4F.

Figure 4G:
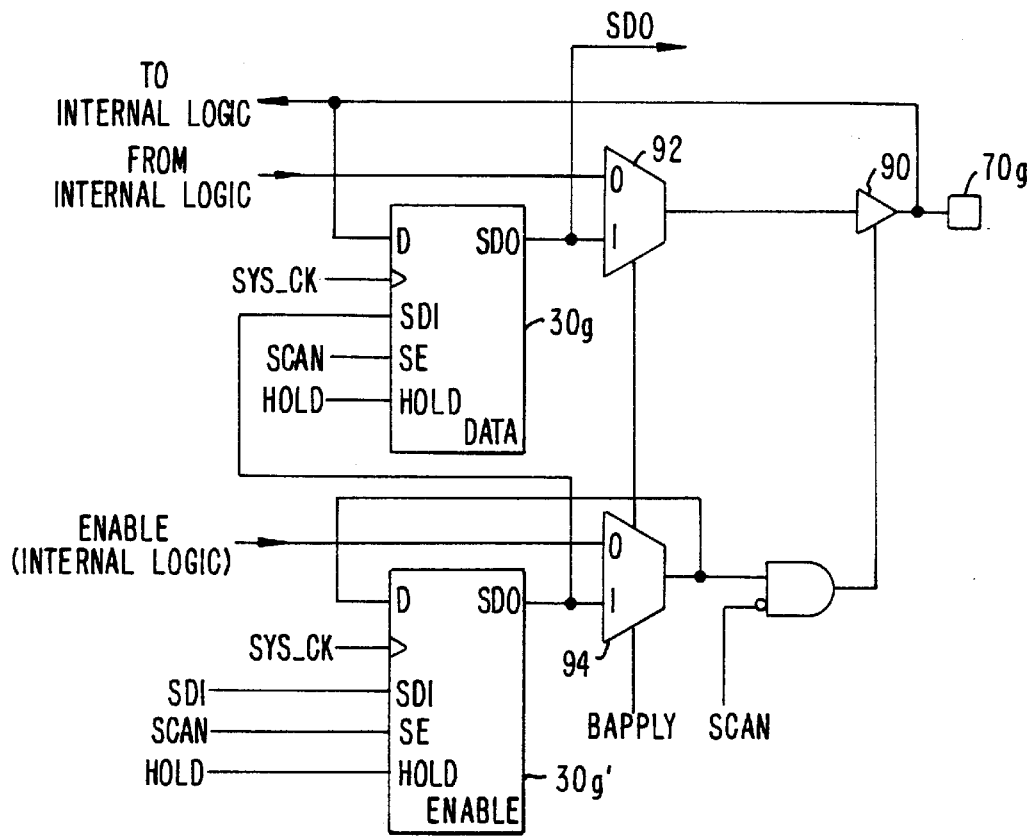

5. Those pin connections of the ASIC 12 that are bi-directional, and not supplied directly with a signal from a scannable register, will require addition of a boundary scannable register in order to, when necessary, override the data supplied by the internal logic 12A to the pin connection (when in output mode), and to allow for sampling of the logic value on the pin. An implementation of this rule is illustrated in FIG. 4G in which the connector pin 70g is coupled directly to the internal logic (for input mode) and receives the output of a tri-state driver circuit 90 that couples, when enabled, the output of a multiplexer 92 to the output pin 70g. The tri-state driver 90 may be enabled by an ENABLE signal supplied by the internal logic 12A, or by the content of the scannable register 30g'. Conversely, the tri-state driver circuit 90 may be disabled (placed in its high impedance or tri-state mode) by the enable signal from the internal logic, the content of the added boundary register 30g' (as selected by the BAPPLY signal), or by asserting the SCAN command.

Figure 4H:
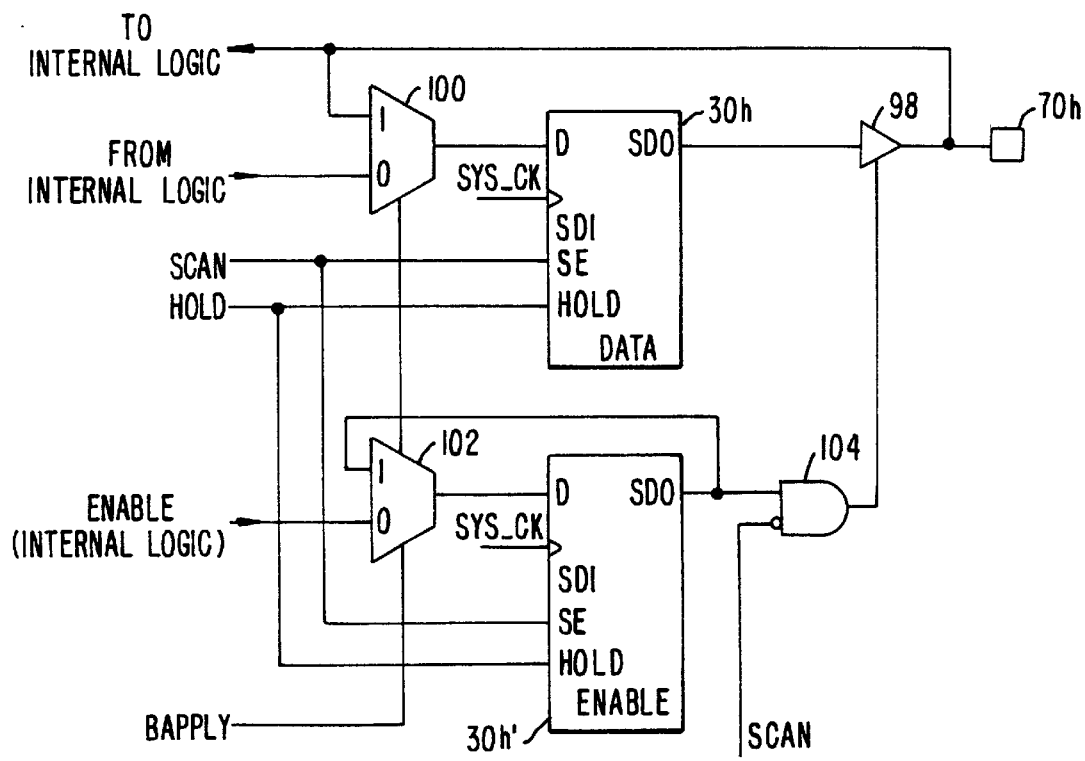

6. Finally, for every pin connection that has bi-directional capability that is directly driven by a scannable register, the register may be shared with boundary scan logic. FIG. 4H shows this implementation.

Note that the additional boundary register for tri-state control (scannable register 30h') for controlling the tri-state condition of the driver circuit 98 via the AND gate 104 in similar fashion as above.

Figure 5A:
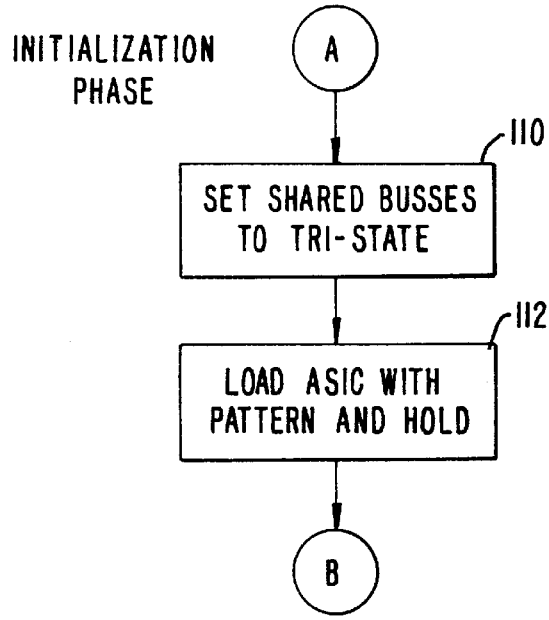
FIGS. 5A–5C is a flow diagram, broadly illustrating the method of the present invention.
Figure 5B:
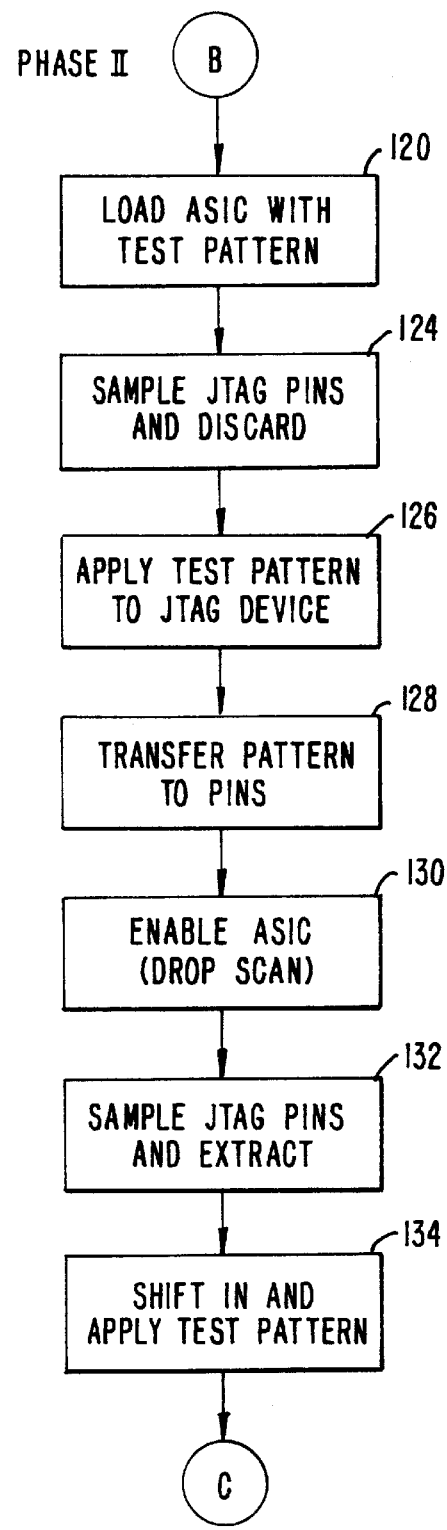
Figure 5C:
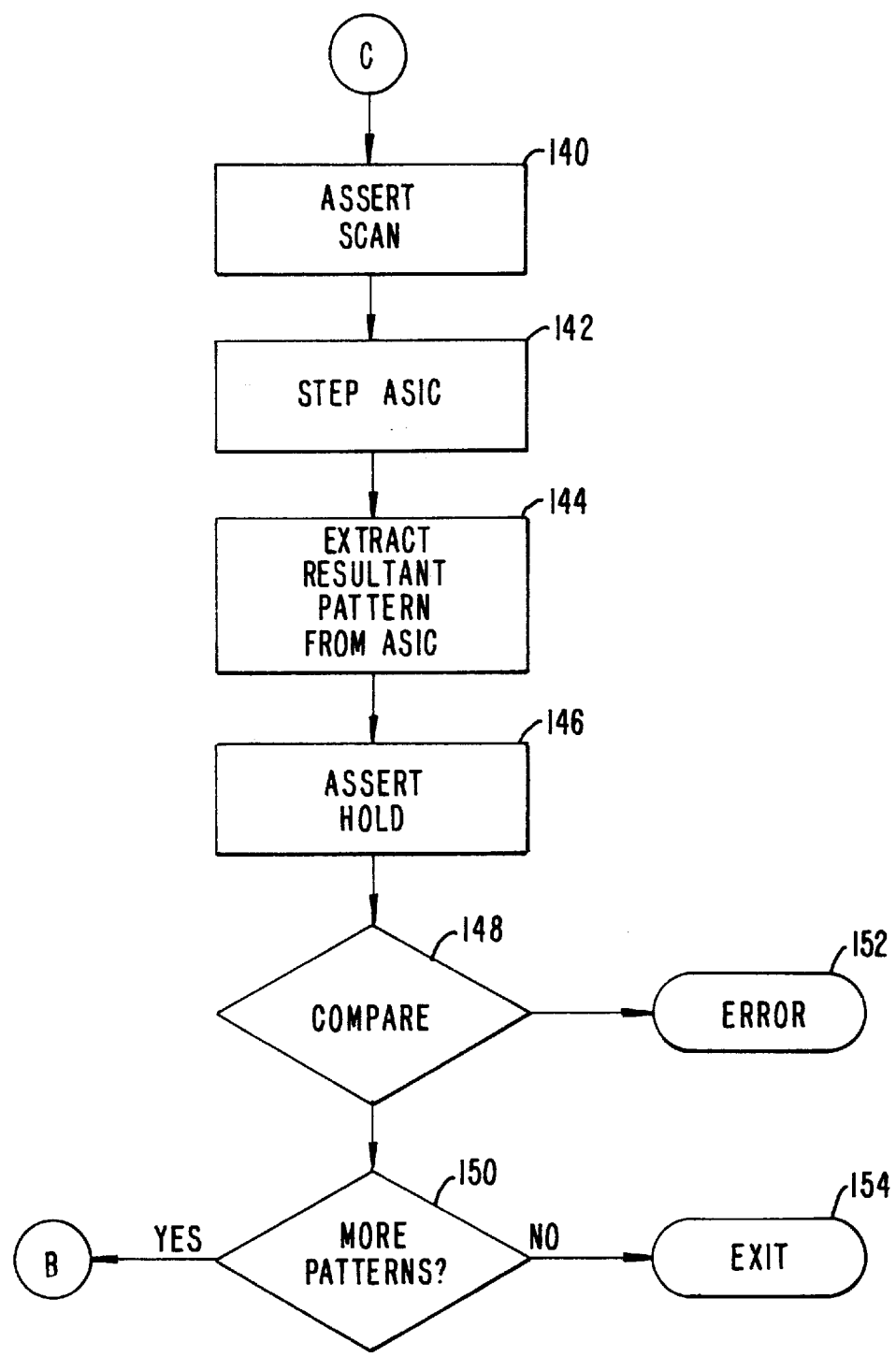

Having now reviewed the different architectures employed by the ASIC 12, and JTAG device 14, the invention may now best be described for testing the interconnect 22 between the JTAG 14 and ASIC 12 with respect to FIGS. 5A–5C. Turning first to FIG. 5A, which illustrates the Initialization Phase of the procedure for both devices 12, 14, the operation is entered at A by the test processor 16 where, at step 110, the test processor will cause all shared buses to which the ASIC 12 and JTAG device 14 connect to be placed in their tri-state or high-impedance modes. The reason for this is to ensure that such shared buses are not attempted to be simultaneously driven by two separate sources, which can cause electrical damage. Thus, in the case of the ASIC 12, the test processor 16 will assert the SCAN test signal which, as shown in FIGS. 4D, 4F, 4G, and 4H will disable the corresponding tri-state driver circuits (i.e., place them in their tri-state or high impedance modes). At the same time, the test processor 16 will assert the $TRI_{13}ST$ signal that is applied to the JTAG device which causes it, similarly, to force tri-state drivers to their high impedance modes.

The Initialization Phase then moves to step 112 where the ASIC 12 is loaded with an initialization pattern to place the boundary registers controlling tri-state devices (e.g., scannable boundary registers 30d', 30f', 30g', and 30h', FIGS. 4D, 4F, 4G and 4H), to a state that, if applied to the tri-state control of the corresponding driver circuit, will hold it in its disabled state. The initialization pattern is applied merely by holding the SCAN test signal asserted (and the HOLD test signal de-asserted), and applying the initialization pattern to the SDI input of the ASIC 12. As discussed above, the SCAN signal, in addition to forcing all tri-state drivers to their high impedance states, will place all scannable registers, including the scannable boundary registers, of the ASIC 12 in its scan chain test mode for receiving the initialization pattern (under control of the free-running $SYS_{13}CK$ signal). When the pattern has been installed, the HOLD signal is asserted to hold the pattern. Step 112 exits at B in favor of the interconnect test phase for the JTAG device 14.

FIG. 5B illustrates the next phase of the test procedure, Phase II, in which signals communicated by the interconnect 22 from the ASCI 14 to the JTAG device 14 are sampled. Phase II is entered at step 120 with the ASIC 12 being provided a test pattern so that those pin connections 70 of the ASIC 12 that are received by the JTAG device 14 (including shared bus connections) are set to signals with known states. Thus, in step 120, while SCAN continues to be asserted, the HOLD signal is dropped and the test pattern applied in serial fashion to the SDI input of the ASIC 12. When the test pattern has been fully applied, the output pin connections of the ASIC 12 that connect (by interconnect 22) to the JTAG device 14 will have their associated scannable boundary registers set to known, predetermined states (e.g., see FIGS. 4C, 4D, 4E, 4F, 4G and 4H, and HOLD asserted to hold the states. (The content of the scannable boundary registers cannot yet be applied to the those connector pins 70 that are driven by tri-state devices because the SCAN signal is still asserted, placing them in their high-impedance, tri-state modes.)

Next, at steps 124 and 126, a test pattern is scanned into the scannable data register 40 of the JTAG device 14 in the manner specified by the Standard (1149.1), according to the state diagram 50 (FIG. 3). Briefly, as the state diagram 50 shows, the state machine 40 is operated by the test processor 16 (through the TMS and $T_{13}CK$ signals) to step from the Idle state 50 to and through the data register gateway state 52 to the "Capture" state 56. In the Capture state 56 the scannable data register 42 will sample and hold the signals communicated to the JTAG device 14 by the interconnect 22. The Capture state 56 is left in favor of a Shift state 58 where (by dropping the TMS signal and continuing the $T_{13}CK$ signal) the information captured during the step Capture state 56 is extracted form the scannable data register 42. (State 56, as FIG. 3 shows, may also be left in favor of an Exit state 60 that provides a bypass of the Shift state 58. State 60 is not used in the operation of the present invention.) The information extracted from the scannable data register is discarded. It was obtained only because the Capture state 56 must be passed through in order to get to the Shift state 58 where a test pattern can be applied to the scannable data register 42 (step 126 of Phase II; FIG. 5B)

The scannable data registers 42 operate in a master/slave fashion in that test signals applied will not appear at the outputs until caused to do so by passing through the Update state 62 of the state diagram 50 (FIG. 3). Thus, step 126 of Phase II (FIG. 5B) will have the test processor 16 operating the state machine 40 (with the test signals TMS and $T_{13}CK$) to do just that, returning to the Idle state 51. Completion of step 126 will, therefore, have the content of the register 42 applied to the corresponding pin connections of the JTAG device 14 that connect to the interconnect 22.

Continuing with Phase II, step 130 applies the test pattern contained in the boundary registers 30 of the ASIC 12 to their corresponding pin connections 70 by dropping the SCAN test signal. (The HOLD test signal remains asserted.) Referring for the moment to FIG. 4D, as an example of what happens, with the BAPPLY signal asserted, the SDO outputs of the scannable boundary registers 30D and 30D' are respectively applied to the inputs of the driver circuit 74 and one of the inputs of the AND gate 80. With the SCAN signal not asserted, the enabling or disabling of the driver circuit 74 is controlled by the content of the scannable register 30D' and, here, is enabled. The content of the scannable boundary register 30d is coupled to the pin connection 70D. In similar fashion the scannable registers 30e, 30f, 30g, and 30h are applied to their corresponding pin connections 70. (See FIGS. 4E–4H.)

At step 132, the signals applied to the connector pins of the JTAG device 14, connected to the interconnect 22, are sampled by commanding the state machine 40 to proceed through step 52 to step 56, where the signals are sampled and loaded in the corresponding register positions of the register 42, and at step 58 shifted out and saved for comparison. Since the sampling step 132 has destroyed the test pattern applied to the data register 42 at step 126, the test pattern is again shifted in to the data register 40 and applied to the pins at step 134, in the same manner as was done in steps 124 and 126. Phase III (FIG. 5C) is then exited at C in favor of entering phase III.

Referring now to FIG. 5C Phase III is used to now sample the signals applied to the pin connections of the ASIC 12. Thus, phase III is entered at C and begins with step 140, where the test processor 16 asserts the SCAN test signal to ensure that all shared buses to which the ASIC 12 attaches are not driven by the ASIC. Next, at step 142, the ASIC is allowed to execute one normal cycle by dropping both the SCAN and HOLD signals for one cycle of $SYS_{13}CK$. The SCAN and HOLD signals are then immediately asserted. The affect of this is to have the ASIC 12 sample those pin connections that are inputs to the ASIC 12.

At step 144, the resultant pattern is extracted from the ASIC by dropping the HOLD test signal, and leaving the SCAN test signal asserted until the pattern is fully extracted. Then, at step 146, the HOLD signal is asserted.

Now having sampled the interconnect 22 at both ends (at the JTAG 14 end and at the ASIC 12 end), the sampled signals are compared to standard patterns of what the sampled signals should be if the interconnect 22 is not faulty. If the comparison so indicates, the routine will be exited by the test processor at step 152 with an ERROR indication that the interconnect is suspect. If the comparisons are equal, phase III proceeds to step 150 to determine if more patterns need be run. There should be as many test patterns to exercise all possible conditions and states on the interconnect 22 at both ends, i.e., from the ASIC 12 and from the JTAG device 14. Accordingly, step 150 will proceed to point A and on to step B of phase II where new test patterns are entered into both the ASIC 12 and JTAG device 16, sampled, and, in phase III, compared (FIGS. 5B and 5C, respectively). The extracted samples are compared to the standard patterns of what the extracted patterns (samples) should be. If all test patterns have been applied, step 150 will exit the test procedure at step 154.

While a full and complete disclosure of the invention has been presented herein, it will be obvious to those skilled in the art that various modifications and alterations of the invention can be made. For example, while the ASIC 12 has been described as employing a PRST architecture, and using those scannable registers of that architecture (supplemented as necessary by non-shared scannable boundary registers, i.e., scannable register that perform only in the interconnect test procedure of the present invention), there is no reason why the ASIC 12 requires such architecture for the present invention, as long as there are scannable boundary registers for sampling signals communicated on the interconnect 22, and for applying signals to the interconnect 22. Alternatively, the ASIC 12 may employ other scan architectures having scannable registers that lend themselves to use in the present invention. Further, although the digital systems have been described herein as integrated circuits, employment of the present invention does not require them to be integrated circuits. Finally, as will be apparent to those skilled in this art, the method of the present invention is invariant as to which device (the ASCI 12 or the JTAG device 14) is driving the shared bus 22a, as long as only one is doing so.

What is claimed is:

1. A method of testing an interconnect that couples first and second digital circuits to one another for communicating data signals therebetween, the first digital circuit being structured to include a scan architecture specified by IEEE Standard 1149.1 that includes a first number of scannable data registers, the second digital circuit employing a scan architecture different from that of the first digital circuit that includes a second number of data registers, the first and second numbers of scannable data registers being coupled to the interconnect for applying data signals thereto and to receive data signals therefrom, the method including the steps of:
   (a) applying a first test pattern to the second number of scannable data registers;
   (b) sampling the interconnect with the first number of scannable data registers according to a protocol required by the IEEE Standard 1149.1 that includes the steps of,
      (i) capturing data signals of the interconnect by the first number of scannable data registers,
      (ii) shifting into the first number of scannable data registers a second test pattern,
      (iii) again capturing data signals of the interconnect by the first number of scannable data registers, and
      (iv) shifting the captured data signals from the first number of scannable data registers;
   (c) sampling data signals on the interconnect by the second number of scannable data registers;
   (d) shifting the sampled data signals from the second number of scannable data registers; and
   (e) comparing the captured data signals and the sampled data signals to first and second standard patterns, respectively, to determine the integrity of the interconnect; and
   (f) repeating steps (a)–(e) for a plurality of additional test patterns.

2. The method of claim 1, wherein the interconnect includes a shared bus, and the first and second digital circuits include driver circuits having outputs coupled to the shared bus and capable of being placed in high impedance states, and including the step of placing the outputs of the driver circuits of the first and second digital circuits in their high impedance states during each of the applying steps.

3. The method of claim 1, wherein the first and second digital circuits are each integrated circuits.

4. The method of claim 1, including a test processor for providing the test signals to the first and second digital systems.

5. The method of claim 4, wherein the test signals include a test clock signal and a test mode select signal that is applied to the first integrated circuit.

* * * * *